(12) United States Patent
Eckert et al.

(10) Patent No.: US 10,114,069 B2
(45) Date of Patent: Oct. 30, 2018

(54) METHOD FOR ELECTRICAL TESTING OF A 3-D CHIP STACK

(71) Applicant: INTERNATIONAL BUSINESS MACHINES CORPORATION, Armonk, NY (US)

(72) Inventors: Martin Eckert, Moetzingen (DE); Eckhard Kunigkeit, Stuttgart (DE); Otto A. Torreiter, Leingelden-Echterdingen (DE); Quintino L. Trianni, Boeblingen (DE)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 208 days.

(21) Appl. No.: 14/965,163

(22) Filed: Dec. 10, 2015

(65) Prior Publication Data

US 2016/0097807 A1    Apr. 7, 2016

Related U.S. Application Data

(63) Continuation of application No. 14/082,528, filed on Nov. 18, 2013, now Pat. No. 9,250,289.

(30) Foreign Application Priority Data

Feb. 22, 2013  (GB) .................................. 1303177.8

(51) Int. Cl.
G01R 31/28      (2006.01)
H05K 3/34       (2006.01)
(Continued)

(52) U.S. Cl.
CPC ..... *G01R 31/2886* (2013.01); *G01R 31/2896* (2013.01); *H01L 22/14* (2013.01);
(Continued)

(58) Field of Classification Search
CPC .... H05K 3/325; H05K 3/341; G01R 31/2886; G01R 31/2896; H01L 22/14;
(Continued)

(56) References Cited

U.S. PATENT DOCUMENTS 4,437,718 A * 3/1984 Selinko ................. H05K 3/325
                                                       439/260
5,789,930 A * 8/1998 Isaacs ................. G01R 31/2886
                                                       324/762.03
(Continued)

FOREIGN PATENT DOCUMENTS

JP          2004128014 A  *  4/2004   ......... H01L 23/5382

OTHER PUBLICATIONS

Dang et al., "Assembly, Characterization, and Reworkability of PB-Free Ultra-Fine Pitc C2S for System-On-Package", Electronic Components & Technology Conference, date of Conference: May 29-Jun. 1, 2007, pp. 42-48.
(Continued)

*Primary Examiner* — A. Dexter Tugbang
(74) *Attorney, Agent, or Firm* — Margaret A. McNamara, Esq.; Kevin P. Radigan, Esq.; Heslin Rothenberg Farley & Mesiti P.C.

(57) ABSTRACT

A method for electrical testing of a 3-D integrated circuit chip stack is described. The 3-D integrated circuit chip stack comprises at least a first integrated circuit chip and a second integrated circuit chip. The first integrated circuit chip and the second integrated circuit chip are not soldered together for performing electrical testing.

4 Claims, 2 Drawing Sheets

(51) Int. Cl.
  *H01L 25/065* (2006.01)
  *H01L 23/498* (2006.01)
  *H05K 3/32* (2006.01)
  *H01L 21/66* (2006.01)
  *H01L 23/31* (2006.01)

(52) U.S. Cl.
  CPC .. *H01L 23/49811* (2013.01); *H01L 23/49816* (2013.01); *H05K 3/325* (2013.01); *H05K 3/341* (2013.01); *H01L 23/3128* (2013.01); *H01L 25/0652* (2013.01); *H01L 25/0657* (2013.01); *H01L 2224/13* (2013.01); *Y10T 29/49004* (2015.01); *Y10T 29/4913* (2015.01); *Y10T 29/49149* (2015.01)

(58) Field of Classification Search
  CPC ........... H01L 2224/13; H01L 23/49811; H01L 23/49816; H01L 25/0652; H01L 25/0657; H01L 23/3128; Y10T 29/49004; Y10T 29/4913; Y10T 29/49149
  See application file for complete search history.

(56) References Cited

U.S. PATENT DOCUMENTS

| | | | |
|---|---|---|---|
| 6,972,581 | B2 | 12/2005 | Yamashita et al. |
| 7,478,280 | B2 | 1/2009 | Dean et al. |
| 7,796,400 | B2 * | 9/2010 | Kledzik ............. H01L 21/0657 |
| | | | 174/260 |
| 8,213,184 | B2 | 7/2012 | Knickerbocker |
| 2002/0043984 | A1 | 4/2002 | Torreiter |
| 2005/0023657 | A1 * | 2/2005 | Tsai .................... H01L 23/3128 |
| | | | 257/678 |
| 2006/0014309 | A1 | 1/2006 | Sachdev et al. |
| 2006/0131740 | A1 * | 6/2006 | Kawabata ......... H01L 23/49816 |
| | | | 257/723 |
| 2007/0018300 | A1 * | 1/2007 | Ryu ................... G01R 31/2886 |
| | | | 257/686 |
| 2011/0019377 | A1 | 1/2011 | Kledzik et al. |
| 2011/0183447 | A1 | 7/2011 | Lee |
| 2012/0126844 | A1 | 5/2012 | Yasuta et al. |
| 2012/0168964 | A1 | 7/2012 | Kim |
| 2012/0194209 | A1 | 8/2012 | Van Der Zon |
| 2014/0300382 | A1 | 10/2014 | Eckert et al. |

OTHER PUBLICATIONS

Marinissen, E.J., "Testing TSV-Based Three-Dimensional Stacked ICS", Design, Automation & Test in Europe Conference & Exhibition, date of Conference: Mar. 8-12, 2010, pp. 1689-1694.

Search Report for GB Application Serial No. 1303177.8, filed Feb. 22, 203, dated Jun. 28, 2013 (4 pages).

Eckert et al., Notice of Allowance for U.S. Appl. No. 14/082,528, filed Nov. 18, 2013 (U.S. Pat. No. 2014/0300382 A1), dated Sep. 29, 2015 (22 pages).

Eckert et al., "List of IBM Patents or Patent Applications Treated as Related", U.S. Appl. No. 14/965,163, filed Dec. 10, 2015 (2 pages).

* cited by examiner

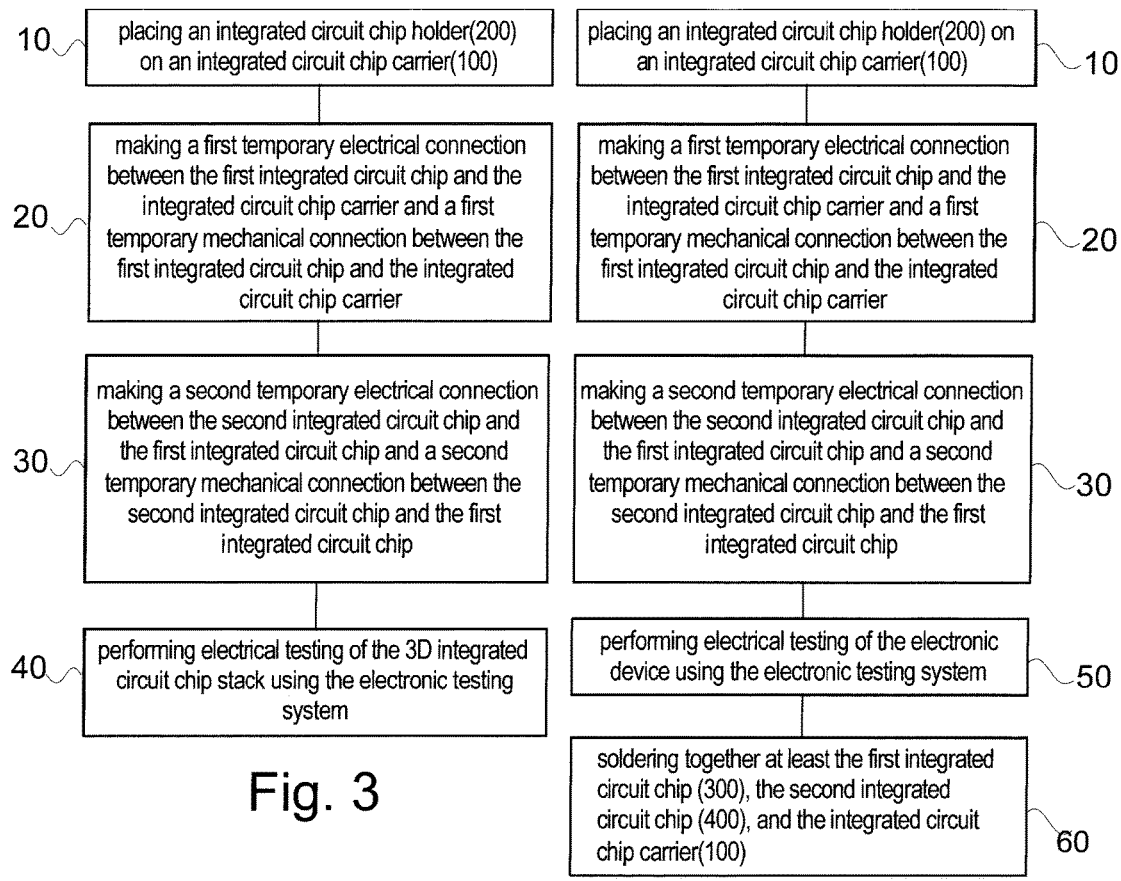
Fig. 3
Fig. 4
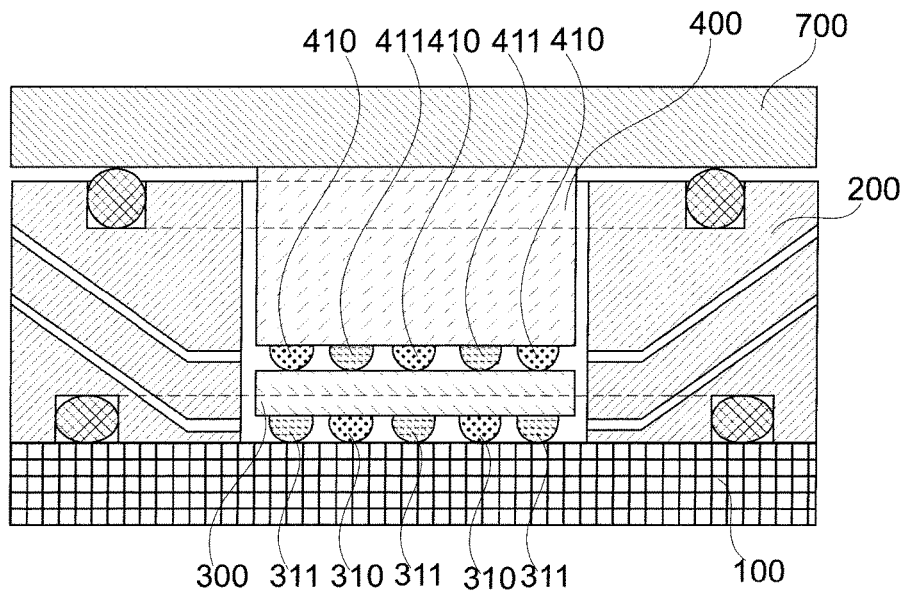
Fig. 5

METHOD FOR ELECTRICAL TESTING OF A 3-D CHIP STACK

PRIOR FOREIGN APPLICATION

This application claims priority from United Kingdom patent application Serial No. GB 1303177.8, filed Feb. 22, 2013, which is hereby incorporated herein by reference in its entirety.

BACKGROUND

At dawn of the Computer Era, integrated circuits (ICs) consisted of a single integrated circuit chip attached to an integrated circuit chip carrier in a single package. The integrated circuit chip carriers and the integrated circuit chips had small number of interconnections made by wire bonding. Quality control and/or performance evaluation of IC parts was possible to perform before assembling all IC parts in one package.

Complexity of modern technology for IC manufacturing has drastically increased. In our days modern ICs often comprise several integrated circuit chips assembled in 3-D integrated circuit chip stacks. The interconnections between integrated circuit chips are made using flip chip controlled collapse chip connection (C4). This interconnection technology employs arrays of solder bumps between adjacent surfaces of integrated circuit chips of the 3-D integrated circuit chip stacks. The same technology can be used for making interconnects between the 3-D integrated circuit chip stacks and the integrated circuit chip carriers. The increase in IC complexity is manifested not only in increase in a number of interconnections between the integrated circuit chips of the 3-D integrated circuit chip stacks and between the 3-D integrated circuit chip stacks and integrated circuit chip carriers but in an increased complexity of the IC parts themselves. For instance modern integrated circuit chip carriers can comprise not only contact pads, metal wiring, and pins as their predecessors but passive and/or active electronic parts well. The modern integrated circuit chip carriers can further comprise separate integrated circuit chips attached next to the 3-D integrated circuit chip stacks. On top of it aforementioned interconnections in modern ICs are pushed to the extreme and play a crucial role in IC performance. As a result required performance of these interconnections, the IC parts, and entire IC can be achieved and evaluated only when all IC parts of one IC package are assembled together.

SUMMARY

According to one embodiment of the present invention, a method is presented for electrical testing of a 3-D integrated circuit chip comprising at least a first integrated circuit chip and a second integrated circuit chip. The first integrated circuit chip and the second integrated circuit chip are not soldered together for performing electrical testing, and the method includes: placing an integrated circuit chip holder on an integrated circuit chip carrier, wherein the integrated circuit chip carrier is operable for electrically connecting the 3-D chip stack with an electronic testing system; making a first temporary electrical connection between the first integrated circuit chip and the integrated circuit chip carrier, and a first temporary mechanical connection between the first integrated circuit chip and the integrated circuit chip carrier, wherein the integrated circuit chip holder is operable for making the first temporary electrical connection and the first temporary mechanical connection; making a second temporary electrical connection between the second integrated circuit chip and the first integrated circuit chip, and a second temporary mechanical connection between the second integrated circuit chip and the first integrated circuit chip, wherein the integrated circuit chip holder is operable for making the second temporary electrical connection and the second temporary mechanical connection; and performing electrical testing of the 3-D integrated circuit chip stack using the electrical testing system.

BRIEF DESCRIPTION OF THE DRAWINGS

In the following, embodiments of the invention will be described in greater detail by way of example only making reference to the drawings in which:

FIG. 3 is a flow chart diagram of a method for electrical testing of the 3-D integrated circuit chip stack, in accordance with one or more aspects of the present invention;

FIG. 4 is a flow chart diagram of a method for manufacturing of an electronic device, in accordance with one or more aspects of the present invention; and FIG. 5 is a cross-section of a mechanical assembly having the first integrated circuit chip and the second integrated circuit chip installed, wherein first (second) solder bumps are replenished with first (second) insulating spacers, in accordance with one or more aspects of the present invention.

DETAILED DESCRIPTION

The present invention provides for embodiments that fill the need of effective electrical testing of 3-D integrated circuit (IC) chip stacks. Yet other embodiments of the present invention fill the need of effective manufacturing of ICs comprising 3-D integrated circuit chip stacks. Methods and tools described in the embodiments of the present invention provide for electrical testing of parts of the 3-D integrated circuit chip stacks without soldering these parts together. Those skilled in the art will readily understand advantages of these methods and tools, because performance evaluation and quality control of the IC parts can be often only made when all IC parts of one package are soldered together. This way of testing results in a loss of the entire IC, because it is practically impossible to substitute a faulty part of the IC when all parts of the IC are soldered together. In contrast, the methods and the tools of the present invention enable substitution of the faulty part of the IC without scrapping the rest good parts of the IC with subsequent continuation of testing of the IC. This approach can speed up development projects, because less IC parts and fewer tests will be needed to achieve the same project objectives when the IC parts are soldered together for testing. This approach can increase a yield of manufacturing processes as well. It enables substitution of faulty IC parts without scrapping the rest good parts of the IC. This technology can be of value especially for small scale production, where "manual tuning" is required. In this case it will be possible to select combinations of chips that have required performance.

It should be appreciated that the present invention can be implemented in numerous ways, including as a method, a mechanical assembly, and a system. Several exemplary embodiments are described below. It will be apparent to those skilled in the art that the present invention may be practiced without some or all specific details set forth therein.

Figure 1:
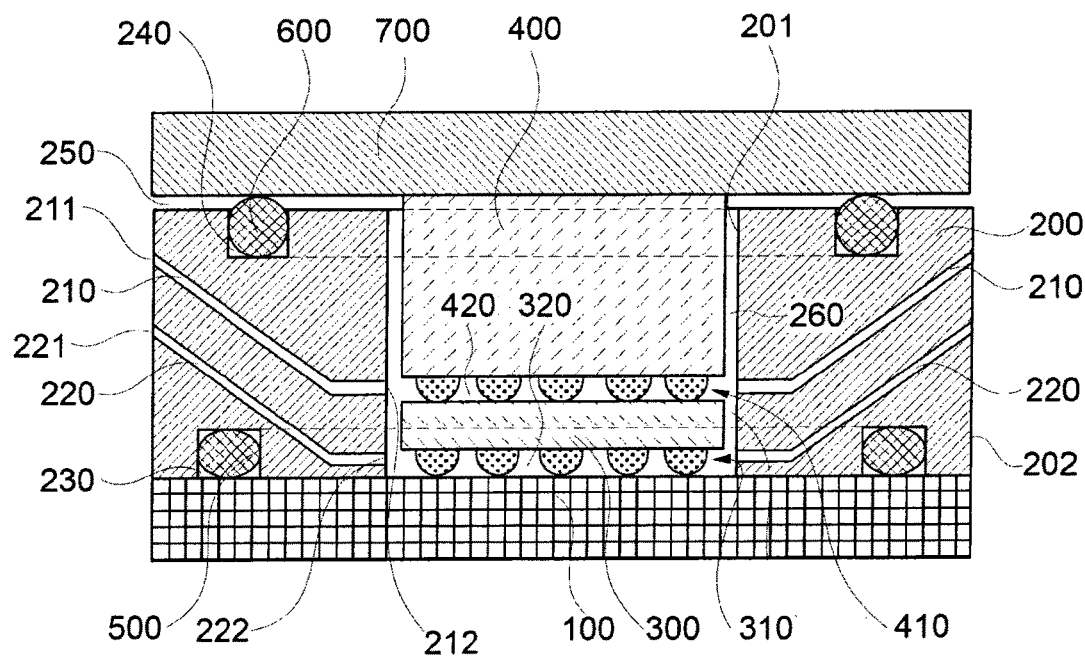
FIG. 1 is a cross-section of a mechanical assembly having a first integrated circuit chip and a second integrated circuit chip installed, in accordance with one or more aspects of the present invention.

FIG. 1 illustrates is a cross-section of a mechanical assembly having a first integrated circuit chip 300 and a second integrated circuit chip 400 installed. The mechanical assembly is operable for holding integrated circuit chips of a 3-D integrated circuit chip stack during electrical testing on an integrated circuit chip carrier 100. The 3-D chip stack comprises at least the first integrated circuit chip 300 and the second integrated circuit chip 400. The mechanical assembly is further operable for making a first temporary electrical connection, a first temporary mechanical connection, a second temporary electrical connection, and the second temporary mechanical connection without soldering together at least the first integrated circuit chip 300 the second integrated circuit chip 400, and the integrated circuit chip carrier 100. The first temporary electrical connection and the first temporary mechanical connection are made between first solder bumps 310 attached to a bottom surface of the first integrated circuit chip 300 and contact pads on a top surface of the integrated circuit chip carrier 100. The second temporary electrical connection and the second temporary mechanical connection are made between second solder bumps 410 attached to a bottom surface of the second integrated circuit chip 400 and contact pads on a top surface of the first integrated circuit chip 300. The mechanical assembly comprises the following parts: an integrated circuit chip holder 200 having sidewalls and a heat sink cover 700 covering the top surface of the second integrated circuit 400 and at least a part of a top surface of the integrated circuit chip holder 200.

Inner sides 201 of the sidewalls follow edges of the first integrated circuit chip 300 and edges of the second integrated circuit chip 400. Distances from the inner sides 201 of the sidewalls to the edges of the first integrated chip 300 and to the second integrated chip 400 are less than a minimum of distances between any two second solder bumps attached adjacent to each other and distances between any two first solder bumps attached adjacent to each other. The sidewalls have one or more first holes 220. The first holes 220 have first outer openings 221 on outer sides 202 of the sidewalls. The first holes 220 have first inner openings 222 on the inner sides 201 of the sidewalls abreast a first gap 320 between the bottom surface of the first integrated circuit chip 300 and the top surface of the integrated circuit chip carrier 100. A height of the first gap 320 is determined by a height of the first solder bumps 310. A height of the first inner openings 222 is smaller than the height of the first gap 320. A bottom surface of the integrated chip holder 200 is parallel to the top surface of the integrated circuit chip carrier 100. The bottom surface of the integrated chip holder 200 is in a first temporary rigid mechanical contact with the top surface of the integrated circuit chip carrier 100.

A bottom surface of the heat sink cover 700 is in a second temporary rigid mechanical contact with the top surface of the second integrated circuit chip 400. The bottom surface of the heat sink cover 700 is parallel to the top surface of the integrated circuit chip holder 200 and separated by the third gap 250 from the top surface of the integrated circuit chip holder 200. The heat sink cover is operable for dissipating heat produced in the first integrated circuit chip and the second integrated circuit chip.

In another embodiment the sidewalls have further have one or more second holes 210. The second holes have second outer openings 211 on the outer sides 202 of the sidewalls. The second holes have second inner openings 212 on the inner sides 201 of the sidewalls abreast a second gap 420 between the bottom surface of the second integrated circuit chip 400 and the top surface of the first integrated circuit chip 300. A height of the second gap 420 is determined by a height of the second solder bumps 410. The bottom surface of the second integrated circuit chip is parallel to the top surface of the first integrated circuit chip 300.

Yet in another embodiment a height of the second inner openings holes 212 is smaller than the height of the second gap 420.

Yet in another embodiment the mechanical assembly further comprises all or a portion of the following parts: a first flexible gasket 600 and a second flexible gasket 500. The first flexible gasket 600 is located in a first trench 240 on the top surface of the integrated circuit chip holder 200. The first flexible gasket 600 in a temporary hermetic flexible contact with the bottom surface of the heat sink cover 700 and the first trench 240. The second flexible gasket 500 is located in a second trench 230 on a bottom surface of the integrated circuit chip holder 100. The second flexible gasket 500 is in a temporary hermetic rigid contact with the top surface of the integrated circuit chip holder 100 and the second trench 230.

Yet in another embodiment the mechanical assembly can comprise a mechanical fixture for holding together the integrated circuit chip carrier 100, integrated circuit chip holder 200, and a heat sink cover 700.

Yet in another embodiment the heat sink cover 700 comprises means of active cooling like water cooling, Peltier cooling, air cooling, or a combination thereof.

Yet in another embodiment the mechanical assembly comprises vacuum valves attached to the outer openings 221 and the outer openings 211.

Figure 2:
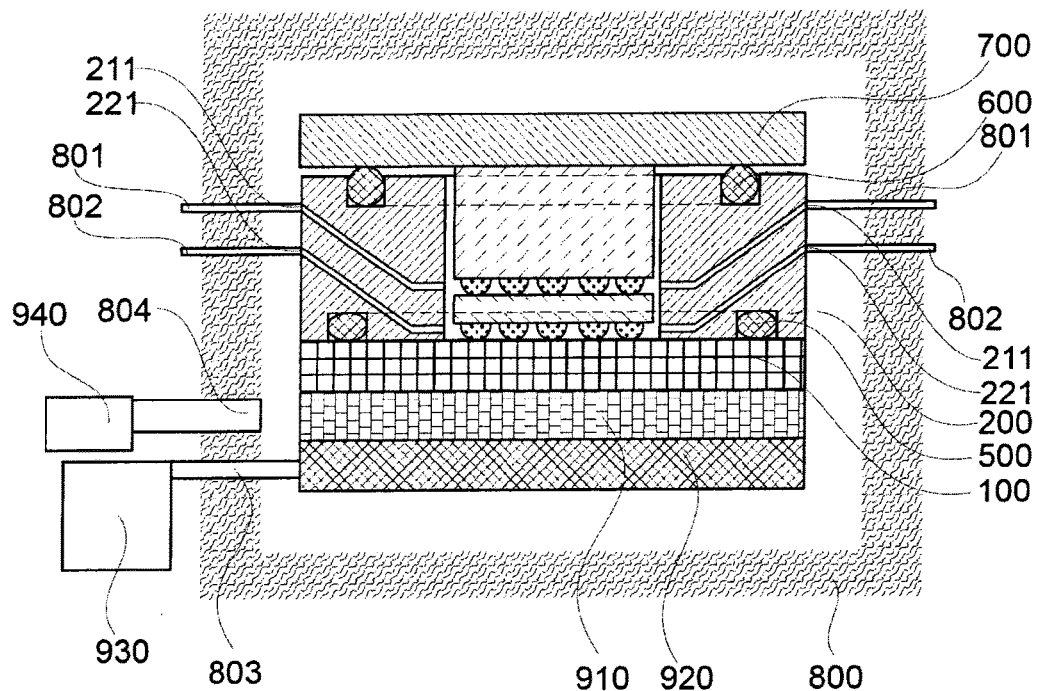
FIG. 2 illustrates a system for electrical testing of a 3-D integrated electronic circuit chip stack, in accordance with one or more aspects of the present invention.

Yet another embodiment provides a system FIG. 2 for electrical testing of an electronic device comprising the 3-D integrated circuit chip stack and the integrated circuit chip carrier 100. The system is operable for making the first temporary electrical connection, the first temporary mechanical connection, the second temporary electrical connection, and the second temporary mechanical connection without soldering together at least the first integrated circuit chip 300 the second integrated circuit chip 400, and the integrated circuit chip carrier 100. The system comprises the following parts: the aforementioned mechanical assembly, a hermetic housing 800, and an electronic testing system 930. The mechanical assembly comprises the following parts: the integrated circuit chip holder 200, the heat sink cover 700, the first flexible gasket 600, and the second flexible gasket 500. The hermetic housing 800 has an electrical feedthrough 803, one or more first vacuum feedthroughs 802, the mechanical assembly installed therein, and an opening 804 for a connection of a pressurizing medium. The first vacuum feedthroughs 802 are connected to the first outer openings 221 of the first vacuum holes 220. The integrated circuit chip carrier 100, the integrated circuit chip holder 200, the heat sink cover 700, the first flexible gasket 600, the second flexible gasket 500 and inner walls of hermetic housing 800 form a hermetic compartment for the pressurizing medium. The electronic testing system 930 is connected via the electrical feedthrough 803 to the electronic device.

Yet in another embodiment the hermetic housing 800 has one or more second vacuum feedthroughs 801 connected to the second outer openings 211.

Yet in another embodiment the second outer openings 211 are connected via the second vacuum feedthroughs 801 to a second source of vacuum.

Yet in another embodiment the first outer openings 221 are connected via the first vacuum feedthroughs 802 to a first source of vacuum.

Yet in another embodiment the hermetic housing 800 is equipped with a mechanical fixture for holding the mechanical assembly inside the hermetic housing 800.

Yet in another embodiment the hermetic housing 800 has additional feedthroughs for providing needed means for active cooling provided by the heat sink cover 700. The additional feedthroughs can be water feedthroughs if the heat sink cover 700 provides water cooling. The additional feedthoughs can be electrical current feedthroughs if the head sink cover 700 provides cooling based on Peltier effect.

Yet in another embodiment the first flexible gasket 600 is less rigid than the 3-D integrated circuit chip stack having at least the first integrated circuit chip 300, the second integrated circuit chip 400, and the integrated circuit chip carrier 100 not soldered together.

Yet in another embodiment the system further comprises a pressurizing medium source 940. The pressurizing medium source 940 is operable for varying a pressure of the pressurizing medium. The pressurizing medium source 940 is connected to the opening 804. The electronic testing system 930 can be operable for testing the first temporary electrical connection and the second temporary electrical connection. The electronic testing system 930 is further operable for controlling the pressurized medium source 940 in a way that the pressure of the pressurizing medium is increased until the first temporary electrical connection and the second temporary electrical connection are made.

Yet in another embodiment the pressurizing medium is a non-corrosive gas. The pressuring medium can be but not limited to argon, helium, nitrogen.

Yet in another embodiment the pressurizing medium is a non-corrosive and non-conductive liquid. The pressurizing medium can be but not limited to perfluorinated or perfluorocarbon liquids.

Yet in another embodiment the system further comprises a test board 920 and a socket 910. The integrated circuit chip carrier 100 is electrically connected via a socket 500 to the test board 920. The test board 920 is electrically connected the electronic testing system 930 via the electrical feedthrough 803.

Yet in another embodiment the hermetic housing 800 is equipped with a mechanical fixture for holding the test board 920 inside the hermetic housing 800.

Yet another embodiment provides a method for electrical testing of a 3-D integrated circuit chip stack. The 3-D integrated circuit chip stack comprises at least a first integrated circuit chip 300 and a second integrated circuit chip 400. The first integrated circuit chip 300 and the second integrated circuit chip 400 are not soldered together for performing electrical testing. The method comprises the following process blocks FIG. 3. Process block 10 comprises placing the integrated circuit chip holder 200 on an integrated circuit chip carrier 100, wherein the integrated circuit chip carrier is operable for electrically connecting of the 3-D chip stack with an electronic testing system 930. Process block 20 comprises making a first temporary electrical connection between the first integrated circuit chip and the integrated circuit chip carrier and a first temporary mechanical connection between the first integrated circuit chip and the integrated circuit chip carrier, wherein the integrated circuit chip holder is operable for making the first temporary electrical connection and the first temporary mechanical connection. Process block 30 comprises making a second temporary electrical connection between the second integrated circuit chip and the first integrated circuit chip and a second temporary mechanical connection between the second integrated circuit chip and the first integrated circuit chip, wherein the integrated circuit chip holder is operable for making the second temporary electrical connection and the second temporary mechanical connection. Process block 40 comprises performing electrical testing of the 3-D integrated circuit chip stack using the electronic testing system 930. Those skilled in the art will readily understand that execution of process blocks 20 and 30 can be done simultaneously.

Yet another embodiment provides a method for manufacturing of an electronic device comprising a 3-D integrated electronic circuit chip stack and the integrated circuit chip carrier 100. The 3-D integrated electronic stack comprises at least a first integrated circuit chip 300 and a second integrated circuit chip 400. The electrical testing is executed before at least the first integrated circuit chip 300, the second integrated circuit chip 400, and the integrated circuit chip carrier 100 are soldered together. The method comprises the following process blocks FIG. 4. The process blocks 10, 20, 30 of this embodiment are the same as the process blocks of the previous embodiment. Process block 50 comprises performing electrical testing of the electronic device using the electrical testing system, wherein at least one of the first integrated circuit chip, the second integrated circuit chip, and the integrated circuit chip carrier being substituted by corresponding equivalent parts until results of electrical testing are accepted. Process block 60 comprises Process block 60 comprises soldering together at least the first integrated circuit chip 300, the second integrated circuit chip 400, and the integrated circuit chip carrier 100 in response to acceptance of the results of electrical testing. Those skilled in the art will readily understand that that execution of process blocks 20 and 30 can be done in an arbitrary order or simultaneously.

The latter two aforementioned methods can further comprise a portion or all of the following features and/or functionalities.

The first temporary electrical connection and the first temporary mechanical connection can be made between first solder bumps 310 attached to a bottom surface of the first integrated circuit chip and contact pads on a top surface of the integrated circuit chip carrier. The second temporary electrical connection and the second temporary mechanical connection can be made between second solder bumps 410 attached to a bottom surface of the second integrated circuit chip and contact pads on a top surface of the first integrated circuit chip.

The first temporary electrical connection and the first temporary mechanical connection can be made by applying a first vacuum via one or more first holes 220 in sidewalls of the integrated circuit chip holder 200. The second temporary electrical connection and the second temporary mechanical connection can be made by applying a second vacuum via one or more second holes in the sidewalls of the integrated circuit chip holder. The second vacuum is not higher than the first vacuum.

The first temporary electrical connection, the first temporary mechanical connection, the second temporary electrical connection, and the second temporary mechanical connection can be further made by hydraulic or pneumatic compression adjusting means. The first integrated circuit chip and the second integrated circuit chip are compressed between the integrated circuit chip carrier and a heat sink cover 700. The heat sink cover covers the top surface of the second integrated circuit and at least a part of a top surface of the integrated circuit chip holder. A bottom surface of the heat sink cover 700 is in a second temporary rigid mechanical contact with the top surface of the second integrated circuit chip 400. The bottom surface of the heat sink cover 700 is parallel to the top surface of the integrated circuit chip holder 200 and separated by the third gap 250 from the top surface of the integrated circuit chip holder 200. The heat sink cover is operable for dissipating heat produced in the first integrated circuit chip and the second integrated circuit chip, wherein the heat sink cover, the integrated circuit chip holder, and the integrated circuit chip holder form a hermetic compartment, wherein a distance between the bottom surface of the heat sink cover 700 and the top surface of the integrated circuit chip carrier can be changed by applying an external hydraulic or air pressure.

The first integrated circuit chip can be less rigid than the second integrated circuit chip.

Homogenization of compression over a first integrated circuit chip area can be achieved by placing first insulating spacers 311 in the first gap 320 and second insulating spacers 411 in the second gap 420 FIG. 5. The first insulating spacers and the second insulating spacers do not compromise the propagation of electrical signals during electrical testing. The first insulating spacers 311 have the same height and rigidity as the first solder bumps 310. The second insulating spacers 411 have the same height and rigidity as the second solder bumps 410. The first insulating spacers are placed next to the first solder bumps in a way that the first insulating spacers and the first solder bumps form a first homogeneous array of first single temporary mechanical contacts between the top surface of the integrated circuit chip carrier and the bottom surface of the first integrated circuit chip. The first single mechanical contacts are equidistant from each other. The second insulating spacers are placed next to the second solder bumps in a way that the second insulating spacers and the second solder bumps form a second homogeneous array of second single temporary mechanical contacts between the top surface of the first integrated circuit chip and the bottom surface of the second integrated circuit chip. The second single temporary mechanical contacts are equidistant from each other. A first pitch of the first homogeneous array of the first single temporary mechanical contacts and a second pitch of the second homogeneous array of the second single temporary mechanical contacts can be different.

Yet in another embodiment the first insulating spacers 311 have the same height, rigidity, and ductility as the first solder bumps 310 and the second insulating spacers 411 have the same height, rigidity, and ductility as the second solder bumps 410.

Merely by way of example, an extended sequence of operations is described in the following embodiment. This sequence of operations of a testing procedure is written in a plain language and supported by a general technical preamble describing main components and their functionalities. This embodiment is presented in a form of a brief manual, regarding utilization of various implementations of the system described in the previous embodiments. This way of exposition will clearly help not only engineers but people not skilled in the art to understand the merit and functioning of the present invention.

For the sake of simplicity the 3-D integrated circuit chip stack is depicted as consisting of a first integrated circuit chip 300 and a second integrated circuit chip 400 (FIG. 1 and FIG. 2). The first integrated chip 300 has first solder bumps 310 attached to a bottom surface of the first integrated circuit chip for making a first temporary electrical contact and a first temporary mechanical contact with corresponding contact pads on a top surface of the integrated circuit chip carrier 100. The second integrated chip 400 has second solder bumps 410 attached to a bottom surface of the second integrated circuit chip 400 for making a second temporary electrical contact and a second temporary mechanical contact with corresponding contact pads on a top surface of the first integrated circuit chip 300. A clearly seen from FIG. 1 the aforementioned contacts can be made by compressing the first integrated circuit chip and the second integrated circuit chip between the integrated circuit chip carrier and a heat sink cover 700. Special attention has to be paid to preventing damage of these chips during compression. Since it is difficult to make solder bumps having absolute identical size, rigidity, ductility, etc. the first integrated circuit chip should preferably be made flexible enough for tolerating inhomogeneity of compression forces produced by each of solder bumps. Homogenization of compression can be further achieved by placing the first insulating spacers 311 and the second insulating spacers 411 next to solder bumps between integrated circuit carrier and integrated circuit chips as depicted in FIG. 5. Special attention should be paid to electrical properties of these insulating spacers, since they cannot compromise propagation of electrical signals the 3-D integrated circuit chip stack during electrical testing. The compression of the 3-D integrated circuit chip stack is achieved by pressurization of the mechanical assembly in a hermetic housing 800. Utilization of a first flexible gasket 600 and a second flexible gasket 500 provides for a hermetic compartment formed by the integrated circuit carrier 100, an integrated circuit holder 200, and the heat sink cover 700. The first flexible gasket 600 is located in a first trench 240 on a top surface of the integrated circuit holder 200 and is in a temporary hermetic flexible contact with a bottom surface of the heat sink cover and the first trench. The top surface of the integrated circuit holder 200 is separated by a third gap 250 from the bottom surface of the heat sink cover 700. The third gap 250 enables compression of the 3-D integrated circuit chip stack during pressurization in the hermetic housing 800, since the heat sink cover 700 does not touch directly the integrated circuit chip holder 200 and a rigidity of the first flexible gasket 600 is much less than a rigidity of the 3-D integrated circuit chip stack. The second flexible gasket 500 is located in a second trench 230 on a bottom surface of the integrated circuit holder. A dedicated mechanical fixture (not depicted on figures) provides rigid contact between the bottom surface of the integrated circuit chip holder and the top surface of the integrated circuit chip carrier, wherein the second flexible gasket 500 is in a temporary hermetic rigid contact with the second trench and the top surface of the integrated circuit chip carrier. The first integrated circuit chip is held in place by applying a first vacuum via fist holes 220 during subsequent mounting of the second integrated circuit chip and the heat sink cover. The second integrated circuit chip is held in place by applying a second vacuum via holes 210 during subsequent mounting of the heat sink cover. It is important to notice that the first vacuum has to be higher as the second vacuum.

The testing procedure can be described briefly as follows:
1. Mount an integrated circuit holder 200 on the integrated circuit chip carrier 100.

2. Place the first integrated circuit chip 300 on the integrated circuit carrier 100 and apply the first vacuum via holes 220.
3. Place the second integrated circuit chip 400 on the first integrated circuit 300 and apply the second vacuum via holes 220.
4. Mount the heat sink cover 700.
5. Increase pressure in the hermetic housing 800 until electrical testing system reports that the first and the second temporary electrical contacts are made.
6. Perform electrical testing.
7. Substitute a faulty component of the 3-D integrated circuit chip stack if any detected by executing aforementioned steps.

The mechanical assembly can be further used for soldering together the components of the 3-D integrated circuit chip stack. Another mechanical fixture is used for holding together parts of the mechanical assembly when the mechanical assembly is dismounted from the hermetic housing and the first and the second vacuums are not applied. When this mechanical fixture is used the mechanical assembly with the first integrated circuit chip and the second integrated circuit chip installed can be put in an oven, where all parts of the 3-D integrated circuit chip stack a soldered together.

To summarize, those skilled in the art will note that the present invention provides, in one aspect, embodiments that fill the need of effective electrical testing of 3-D integrated circuit chip stacks. Yet other embodiments of the present invention fill the need of effective manufacturing of ICs comprising 3-D integrated circuit chip stacks. It should be appreciated that the present invention can be implemented in numerous ways, including as a method, a mechanical assembly, and a system. Several inventive embodiments are summarized below.

One embodiment provides a method for electrical testing of a 3-D integrated circuit chip stack. The 3-D integrated circuit chip stack comprises at least a first integrated circuit chip and a second integrated circuit chip. The first integrated circuit chip and the second integrated circuit chip are not soldered together for performing electrical testing. The method comprises the following process blocks: placing an integrated circuit chip holder on an integrated circuit chip carrier, wherein the integrated circuit chip carrier is operable for electrically connecting of the 3-D chip stack with an electronic testing system; making a first temporary electrical connection between the first integrated circuit chip and the integrated circuit chip carrier and a first temporary mechanical connection between the first integrated circuit chip and the integrated circuit chip carrier, wherein the integrated circuit chip holder is operable for making the first temporary electrical connection and the first temporary mechanical connection; making a second temporary electrical connection between the second integrated circuit chip and the first integrated circuit chip and a second temporary mechanical connection between the second integrated circuit chip and the first integrated circuit chip, wherein the integrated circuit chip holder is operable for making the second temporary electrical connection and the second temporary mechanical connection; and performing electrical testing of the 3-D integrated circuit chip stack using the electrical testing system.

Another embodiment provides a method for manufacturing of an electronic device. The electronic device comprises a 3-D integrated electronic circuit chip stack and an integrated circuit chip carrier. The 3-D integrated electronic circuit chip stack comprises at least a first integrated circuit chip and a second integrated circuit chip. Electrical testing is executed before at least the first integrated circuit chip, the second integrated circuit chip, and the integrated circuit chip carrier are soldered together. The method comprises the following process blocks: placing an integrated circuit chip holder on the integrated circuit chip carrier, wherein the integrated circuit chip carrier is operable for electrically connecting of the 3-D chip stack with an electronic testing system; making a first temporary electrical connection between the first integrated circuit chip and the integrated circuit chip carrier and a first temporary mechanical connection between the first integrated circuit chip and the integrated circuit chip carrier, wherein the integrated circuit chip holder is operable for making the first temporary electrical connection and the first temporary mechanical connection; making a second temporary electrical connection between the second integrated circuit chip and the first integrated circuit chip and a second temporary mechanical connection between the second integrated circuit chip and the first integrated circuit chip, wherein the integrated circuit chip holder is operable for making the second temporary electrical connection and the second temporary mechanical connection; performing electrical testing of the electronic device using the electrical testing system, wherein at least one of the first integrated circuit chip, the second integrated circuit chip, and the integrated circuit chip carrier being substituted by corresponding equivalent parts until results of electrical testing are accepted; and soldering together at least the first integrated circuit chip (300), the second integrated circuit chip, and the integrated circuit chip carrier in response to acceptance of the results of electrical testing.

Yet another embodiment provides a mechanical assembly for holding integrated circuit chips of a 3-D integrated circuit chip stack during electrical testing on an integrated circuit chip carrier. The 3-D chip stack comprises at least a first integrated circuit chip and a second integrated circuit chip. The mechanical assembly is operable for making a first temporary electrical connection, a first temporary mechanical connection, a second temporary electrical connection, and the second temporary mechanical connection without soldering together at least the first integrated circuit chip the second integrated circuit chip, and the integrated circuit chip carrier. The first temporary electrical connection and the first temporary mechanical connection are made between first solder bumps attached to a bottom surface of the first integrated circuit chip and contact pads on a top surface of the integrated circuit chip carrier. The second temporary electrical connection and the second temporary mechanical connection are made between second solder bumps attached to a bottom surface of the second integrated circuit chip and contact pads on a top surface of the first integrated circuit chip. The mechanical assembly comprises the following parts: an integrated circuit chip holder having sidewalls and a heat sink cover covering the top surface of the second integrated circuit and at least a part of a top surface of the integrated circuit chip holder.

Inner sides of the sidewalls follow edges of the first integrated circuit chip and edges of the second integrated circuit chip. Distances from the inner sides of the sidewalls to the edges of the first integrated chip and to the second integrated chip are less than a minimum of distances between any two second solder bumps attached adjacent to each other and distances between any two first solder bumps attached adjacent to each other. The sidewalls have one or more first holes. The first holes have first inner openings on the inner sides of the sidewalls abreast a first gap between the bottom surface of the first integrated circuit chip and the top surface of the integrated circuit chip carrier. A height of the first gap is determined by a height of the first solder bumps. A height of the first inner openings is smaller than the height of the first gap. A bottom surface of the integrated chip holder is parallel to the top surface of the integrated circuit chip carrier. The bottom surface of the integrated chip holder is in a first temporary rigid mechanical contact with the top surface of the integrated circuit chip carrier.

A bottom surface of the heat sink cover is in a second temporary rigid mechanical contact with the top surface of the second integrated circuit chip. The bottom surface of the heat sink cover is parallel to the top surface of the integrated circuit chip holder and separated by the third gap from the top surface of the integrated circuit chip holder. The heat sink cover is operable for dissipating heat produced in the first integrated circuit chip and the second integrated circuit chip.

Yet another embodiment provides a system for electrical testing of an electronic device comprising a 3-D integrated circuit chip stack and an integrated circuit chip carrier. The 3-D integrated circuit chip stack comprises at least a first integrated circuit chip and a second integrated circuit chip. The system is operable for making a first temporary electrical connection, a first temporary mechanical connection, a second temporary electrical connection, and the second temporary mechanical connection without soldering together at least the first integrated circuit chip the second integrated circuit chip, and the integrated circuit chip carrier. The first temporary electrical connection and the first temporary mechanical connection are made between first solder bumps attached to a bottom surface of the first integrated circuit chip and contact pads on a top surface of the integrated circuit chip carrier. The second temporary electrical connection and the second temporary mechanical connection are made between second solder bumps attached to a bottom surface of the second integrated circuit chip and contact pads on a top surface of the first integrated circuit chip. The system comprises the following parts: the aforementioned mechanical assembly, a hermetic housing, and an electronic testing system.

The aforementioned mechanical assembly comprises further the following parts: a first flexible gasket and a second flexible gasket.

The first flexible gasket is located in a first trench on the top surface of the integrated circuit chip holder. The first flexible gasket in a temporary hermetic flexible contact with the bottom surface of the heat sink cover and the first trench. The second flexible gasket is located in a second trench on a bottom surface of the integrated circuit chip holder. The second flexible gasket is in a temporary hermetic rigid contact with the top surface of the integrated circuit chip holder and the second trench.

The hermetic housing has an electrical feedthrough, one or more first vacuum feedthroughs, the mechanical assembly installed therein, and an opening for a connection of a pressurizing medium. The first vacuum feedthroughs are connected to the first outer openings of the first vacuum holes. The integrated circuit chip carrier, the integrated circuit chip holder, the heat sink cover, the first flexible gasket, the second flexible gasket and inner walls of hermetic housing form a hermetic compartment for the pressurizing medium. The electronic testing system is connected via the electrical feedthrough to the electronic device.

What is claimed is:

1. A method for electrical testing of a 3-D integrated circuit chip stack comprising at least a first integrated circuit chip and a second integrated circuit chip, wherein the first integrated circuit chip and the second integrated circuit chip are not soldered together for performing electrical testing, the method comprising:
    placing an integrated circuit chip holder on an integrated circuit chip carrier, wherein the integrated circuit chip carrier is operable for electrically connecting the 3-D integrated circuit chip stack with an electronic testing system;
    placing the first and second integrated circuit chips on the integrated circuit chip carrier, within the integrated circuit chip holder, with the second integrated circuit chip residing on the first integrated circuit chip, and the first integrated circuit chip residing on the integrated circuit chip carrier;
    placing a cover onto the integrated circuit chip holder, including over the first and second integrated circuit chips within the integrated circuit chip;
    making, using an applied pressure, a first temporary electrical connection between the first integrated circuit chip and the integrated circuit chip carrier and a first temporary mechanical connection between the first integrated circuit chip and the integrated circuit chip carrier, wherein the integrated circuit chip holder and the applied pressure facilitate making the first temporary electrical connection and the first temporary mechanical connection, the applied pressure forcing the first integrated circuit chip towards the integrated circuit chip carrier, and the second integrated circuit chip towards the first integrated circuit chip;
    making, using the applied pressure, a second temporary electrical connection between the second integrated circuit chip and the first integrated circuit chip and a second temporary mechanical connection between the second integrated circuit chip and the first integrated circuit chip, wherein the integrated circuit chip holder and the applied pressure facilitate making the second temporary electrical connection and the second temporary mechanical connection; and
    performing electrical testing of the 3-D integrated circuit chip stack using the electrical testing system.

2. The method according to claim 1, wherein:
    the first temporary electrical connection and the first temporary mechanical connection are made between first solder bumps attached to a bottom surface of the first integrated circuit chip and contact pads on a top surface of the integrated circuit chip carrier; and
    the second temporary electrical connection and the second temporary mechanical connection are made between second solder bumps attached to a bottom surface of the second integrated circuit chip and contact pads on a top surface of the first integrated circuit chip.

3. The method of claim 1, further comprising:
    manufacturing an electronic device comprising the 3-D integrated circuit chip stack and the integrated circuit chip carrier;
    wherein the performing the electrical testing of the 3-D integrated circuit chip stack further comprises at least one of the first integrated circuit chip, the second integrated circuit chip, and the integrated circuit chip carrier, being substituted by corresponding equivalent parts until results of electrical testing are accepted; and
    wherein the manufacturing of the electronic device further comprises subsequently soldering together at least the first integrated circuit chip, the second integrated circuit chip, and the integrated circuit chip carrier in response to the results of electrical testing that were accepted.

4. The method of claim 1, further comprising providing the applied force by applying a vacuum via one or more holes in one or more sidewalls of the integrated chip holder.

* * * * *